(12) United States Patent
Salove

(10) Patent No.: US 7,282,997 B2
(45) Date of Patent: Oct. 16, 2007

(54) THERMAL COUPLING DEVICE

(75) Inventor: Matthew Joseph Salove, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 85 days.

(21) Appl. No.: 11/117,832

(22) Filed: Apr. 29, 2005

(65) Prior Publication Data

US 2006/0244537 A1 Nov. 2, 2006

(51) Int. Cl.
*H03F 3/04* (2006.01)
(52) U.S. Cl. .................................. 330/289; 330/207 P
(58) Field of Classification Search ................ 330/289, 330/207 P, 307; 257/579
See application file for complete search history.

(56) References Cited

U.S. PATENT DOCUMENTS

| | | | | |
|---|---|---|---|---|
| 4,389,557 A | * | 6/1983 | Devenyi et al. | ......... 219/85.15 |
| 4,939,562 A | * | 7/1990 | Adlerstein | ................... 257/198 |
| 5,734,193 A | * | 3/1998 | Bayraktaroglu et al. | .... 257/579 |
| 6,884,661 B1 | | 4/2005 | Morris et al. | |
| 2006/0072296 A1 | | 4/2006 | Mays | |

* cited by examiner

*Primary Examiner*—Henry Choe
(74) *Attorney, Agent, or Firm*—Ingrid McTaggart

(57) ABSTRACT

A micro-electronic power amplifier that defines a uniform thermal impedance includes an output stage including a single transistor array including a plurality of emitter leads and a single thermal coupling device that thermally couples together each of the emitter leads.

21 Claims, 2 Drawing Sheets

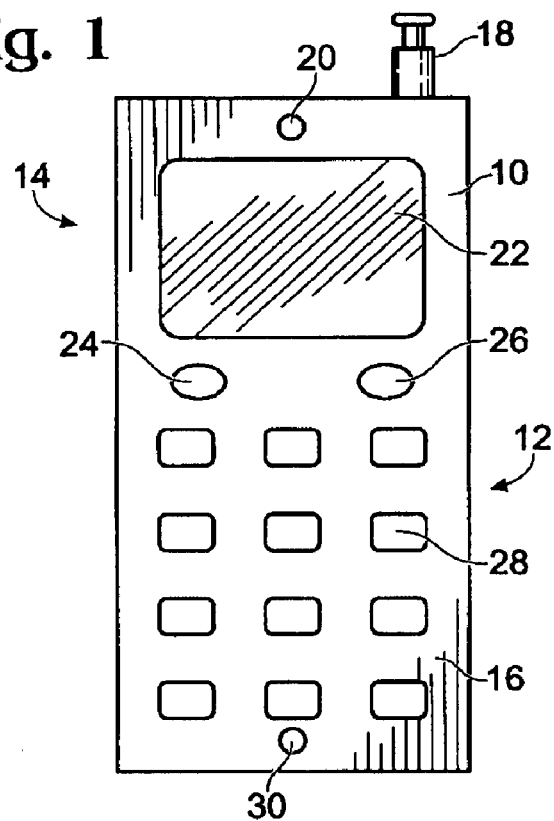
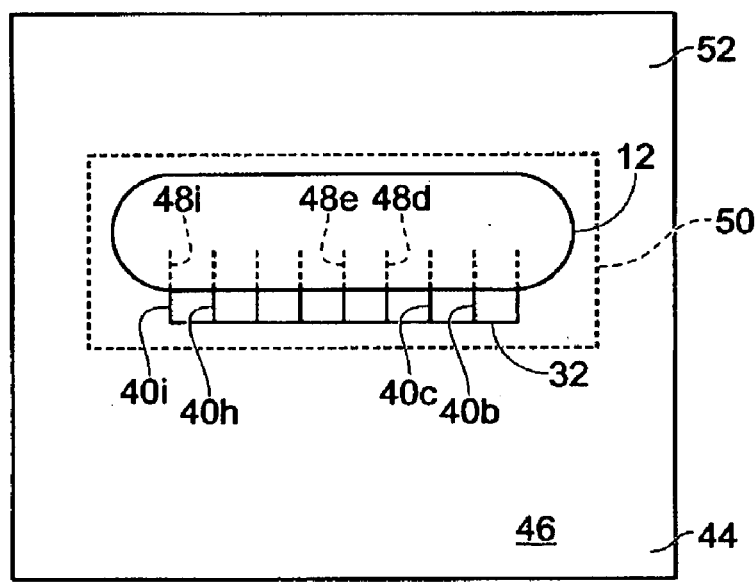

THERMAL COUPLING DEVICE

BACKGROUND

A key component of a cellular phone using the Global System for Mobile Communications (GSM) is the Power Amplifier Module (PAM). Ruggedness of the PAM is determined by load mismatches that the PAM can survive under battery and temperature extremes. Under these extreme conditions, the output stage of the PAM is severely stressed.

The output stage consists of several transistors in parallel in order to meet the power requirements of the GSM phone. As the PAM is stressed, small thermal differences in the emitter paths between the parallel transistors in the output stage can lead to unmatched base-emitter voltages (Vbe). In the extreme environment of high battery voltage and load mismatches where the currents are significantly high, the small differences in Vbe can lead to thermal runaway and the self destruction of the output stage of the PAM. Accordingly, it is desirable to provide a PAM that reduces the thermal differences in the output stage and the effects of load mismatches.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 1 is a schematic front view of one embodiment of an electronic device including one embodiment of a thermal coupling device.

FIG. 3 is a schematic top view of one embodiment of a micro-electronic device, such as a power amplifier, including one embodiment of a thermal coupling device.

DETAILED DESCRIPTION

Figure 2:
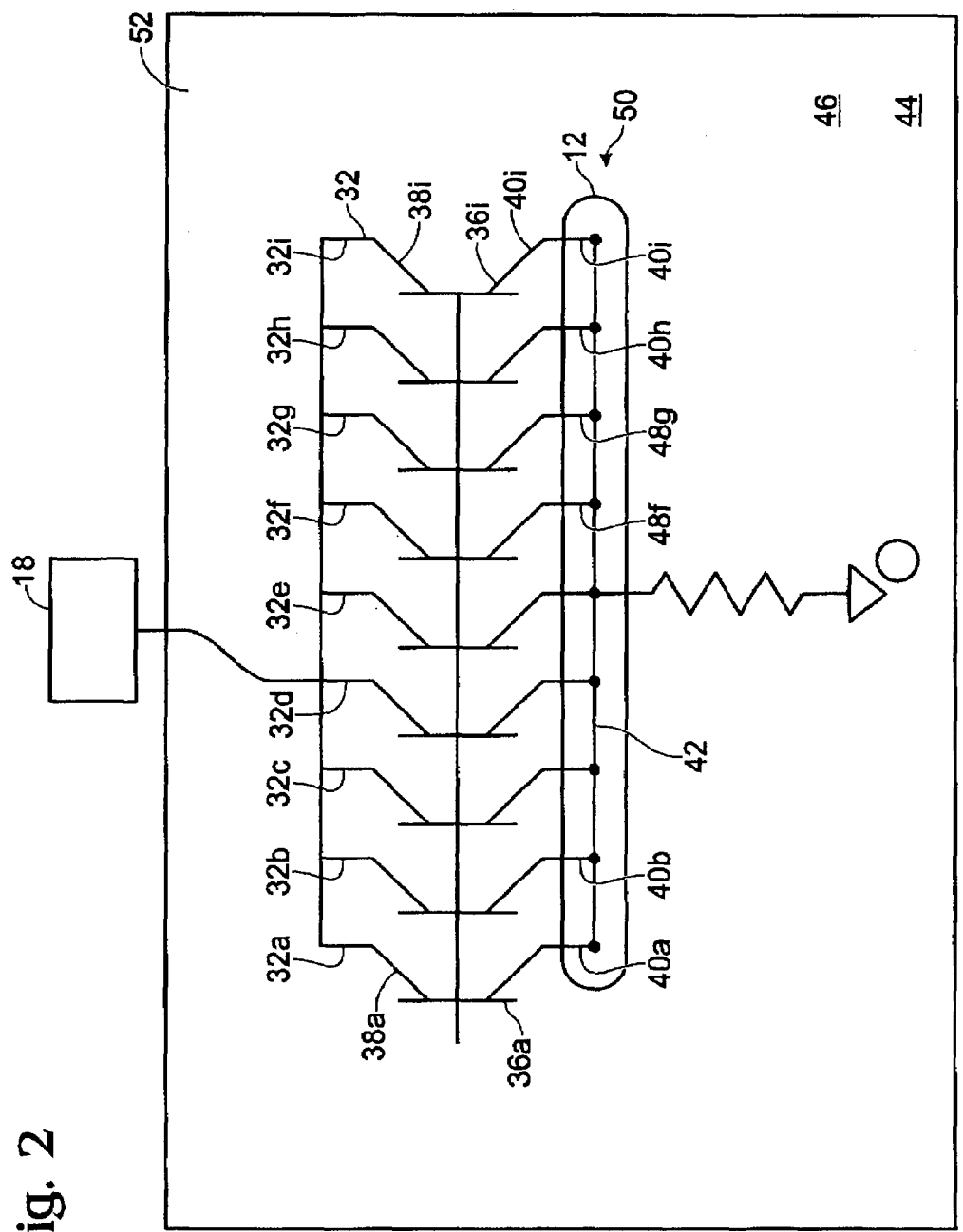
FIG. 2 is a schematic diagram of one embodiment of a transistor array including one embodiment of a thermal coupling device.

In the following description, for purposes of explanation, numerous specific details are set forth. It will be apparent, however, to one skilled in the art that embodiments of the invention can be practiced without these specific details. In other instances, structures and devices are shown in block diagram form in order to avoid obscuring the understanding of this description.

FIG. 1 is a schematic front view of one embodiment of an electronic device 10 including one embodiment of a thermal coupling device 12 positioned in an interior 14 of electronic device 10. Electronic device 10 may be any electronics device but in the example shown is a cellular communication device, such as cellular telephone 16. Telephone 16 may include components such as an antenna 18, an ear piece 20, a display screen 22, toggle keys 24 and 26, a keypad 28 and a mouthpiece or microphone 30. Components 18–30 may each be connected to discrete micro-electronic components within telephone 16, such as transistors 32 (see FIG. 2). In particular, antenna 18 may be connected to a discrete transistor of an output stage of a power amplifier 52 (see FIG. 3) of electronic device 10, as will be described in more detail below.

FIG. 2 is a schematic diagram of one embodiment of a transistor array 32 including one embodiment of thermal coupling device 12. In the example embodiment shown, transistor array 32 is an output stage transistor array 32 including nine individual bipolar transistors 32a–32i. In an example embodiment, antenna 18 may be connected to one of individual transistors, such as to transistor 32d. Each of transistors 32a–32i includes a base 36a–36i, a collector 38a–38i and an emitter 40a–40i, including leads 48a–48i, respectively (only some of which are labeled for ease of illustration). Each of emitters 40a–40i may be electrically connected together at a connection line 42 within a substrate 44 on which transistor array 32 is formed. Other types, numbers, shapes and arrangements of transistors and arrays 32 may be utilized in embodiments of the present invention. Connection line 42 may be positioned at and/or below exposed surface 46 of substrate 44. In an embodiment wherein connection line 42 is positioned below exposed surface 46 of substrate 44, leads 48a–48i of emitters 40a–40i may be positioned on exposed surface 46 such that thermal coupling device 12 may contact each of leads 48a–48i.

Still referring to FIG. 2, thermal coupling device 12, which may also be referred to as a thermal impedance structure 12, may be positioned on and covering connection line 42 such that each of emitters 32a–32i is thermally and electrically connected to thermal impedance structure 12. Thermal impedance structure 12 may extend substantially throughout an emitter region 50 that includes each of emitters 40a–40i, or leads 48a–48i of emitters 40a–40i. Thermal impedance structure 12 may be manufactured of a thermally and/or electrically conductive material, such as a metal, for example, copper.

Thermal impedance structure 12 may be formed on substrate 44 by any process. In one example process, thermal impedance structure 12 is formed on substrate 44 by deposition. Thermal impedance structure 12 may be positioned on exposed outer surface 46 of substrate 44 and may extend upwardly therefrom, i.e., thermal impedance structure 12 may be an upwardly extending bump of thermally conductive material positioned on exposed surface 46 of substrate 44.

FIG. 3 is a schematic top view of one embodiment of a micro-electronic component 52, such as a power amplifier 52, of device 10 (see FIG. 1) including one embodiment of thermal coupling device 12. Component 52 may include substrate 44 having transistor array 32 positioned thereon. Thermal impedance structure 12 may be positioned on exposed surface 46 of substrate 44 such that thermal impedance structure 12 thermally and/or electrically connects each of transistors 32a–32i. In particular, thermal impedance structure 12 may be positioned on and covering each of leads 48a–48i (shown in dash lines underneath thermal impedance structure 12) of emitters 40a–40i positioned in output emitter stage region 50 (shown in dash lines).

Fabrication of device 10, and in particular, fabrication of transistor array 32 having thermal impendence structure 12 positioned thereon, will now be described. First, power amplifier 52 is formed including fabricating single transistor array 32 in an output region 50 of substrate 44. Each of the transistors 32a–32i of array 32 includes an emitter 40a–40i. Thermal impedance structure 12 is then formed on output region 50 such that thermal impedance structure 12 thermally and electrically contacts each of emitters 40a–40i, such as contacting leads 48a–48i of emitters 40a–40i, respectively. In the embodiment shown, thermal impedance structure 12 may be a single copper bump that extends substantially and continuously throughout emitter region 50 of transistor array 32 and may extend upwardly from exposed surface 46 of substrate 44.

Accordingly, thermal impedance structure 12 provides a substantially uniform thermal impedance and a substantially uniform current density in microelectronic power amplifier 52 across each transistor 32a–32i of transistor array 32. Substantially uniform is defined as a difference in a particular property that is immaterial to operation of the device. For example, a substantially uniform thermal impedance means that each of the transistors 32a–32i of transistor array 32 will see a uniform thermal impedance wherein any difference in the thermal impedance between each of the transistors will be immaterial to operation of device 10. Such a substantially uniform thermal impedance and a substantially uniform current density will result in the same parasitic resistance being experienced by each of the transistors 32a–32i of transistor array 32. Such a substantially uniform thermal impedance and a substantially uniform current density may result in no thermal differences between different transistors of array 32.

In a particular example, antenna 18 may be connected to transistor 32d, which may include emitter 40d. If cellular telephone 16 is placed on a metal surface, antenna 18 may be subjected to a lower than normal impedance, such as 10 ohms instead of 50 ohms, for example. If cellular telephone 16 is called while telephone 16 is hooked up to a power source (not shown) for charging, and is positioned on the metal surface (not shown), then power amplifier 52 will be activated. These conditions, including the low impedance to which emitter 40d is subjected, may result in a large current flow through transistor 32d, which may heat that transistor more than the other transistors 32a–32c and 32e–32i, of array 32. Due to the placement of thermal impedance coupling device 12 continuously across each emitters 40a–40i of array 32, heat generated within emitter 40d will be conducted to, and evenly throughout, thermal coupling device 12 such that each of transistors 32a–32i will be subject to a uniform temperature, a uniform thermal impedance and a uniform current density, thereby decreasing the chance of thermal runaway of power amplifier 52, and increasing the robustness of device 10. Accordingly, thermal impedance structure 12 provides an electronic device 10 that is substantially impervious to thermal runaway and substantially impervious to the disadvantages of mismatched load operating conditions.

Reference in the foregoing specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the foregoing specification, the invention has been described with reference to specific embodiments thereof. It will, however, be evident that various modifications and changes can be made thereto without departing from the broader spirit and scope of the invention. The specification and drawings are, accordingly, are to be regarded in an illustrative rather than a restrictive sense. Other variations and modifications of the concepts described herein may be utilized and fall within the scope of the claims below.

What is claimed is:

1. A micro-electronic power amplifier that defines a uniform thermal impedance, comprising:
    an output stage including a single transistor array including a plurality of emitter leads; and
    a single thermal coupling device that thermally couples together each of said emitter leads, wherein said thermal coupling device provides a substantially uniform thermal impedance across each of said plurality of emitter leads.

2. The amplifier of claim 1 wherein said thermal coupling device comprises a bump of material extending upwardly from an emitter region of said power amplifier.

3. The amplifier of claim 1 wherein said thermal coupling device comprises a copper bump.

4. The amplifier of claim 1 wherein said single transistor array includes a plurality of bases and a plurality of collectors, each base and collector corresponding to one of said emitter leads.

5. The amplifier of claim 1 wherein said thermal coupling device extends substantially throughout an emitter region of said power amplifier.

6. The amplifier of claim 1 wherein said thermal coupling device provides a substantially equal current density across said single transistor array.

7. The amplifier of claim 1 wherein said thermal coupling device defines a single parasitic thermal impedance for every transistor of said single transistor array.

8. The amplifier of claim 1 wherein said single transistor array is positioned at an exposed surface of a substrate and wherein said thermal coupling device is formed on said exposed surface.

9. The amplifier of claim 1 wherein said thermal coupling device is manufactured of an electrically conductive material.

10. The amplifier of claim 1 wherein said single transistor array is a parallel array of transistors.

11. A method of providing a uniform thermal impedance in a microelectronic power amplifier, comprising:
    forming a power amplifier including a single transistor array in an output region, wherein each transistor of said single transistor array includes an emitter; and
    forming a single thermal impedance structure that contacts each emitter of said single transistor array,
    wherein said power amplifier is formed on a substrate and wherein said single thermal impedance structure extends upwardly from an exposed surface of said substrate.

12. The method of claim 11 wherein said single thermal impedance structure is deposited on said transistor array.

13. The method of claim 11 wherein said single thermal impedance structure comprises a single copper bump that extends substantially throughout an emitter region of said transistor array.

14. The method of claim 11 wherein said single thermal impedance structure contacts each emitter through an electrically conductive contact.

15. A cellular telephone, comprising:
    a power amplifier wherein all emitter leads of an output region of said power amplifier are thermally coupled together by a single thermal impedance structure such that said power amplifier is impervious to thermal runaway, wherein said thermal impedance structure defines a single thermal resistance across individual transistors of said power amplifier.

16. The telephone of claim 15 wherein said single thermal impedance structure comprises a conductive structure.

17. The telephone of claim 15 wherein said single thermal impedance structure comprises a copper bump.

18. A power amplifier, comprising:
    an output stage including a single transistor array having multiple emitter leads; and a single thermal resistance structure conductively coupled to each of said plurality of said multiple emitter leads of said single transistor array, wherein said single thermal resistance structure defines a uniform thermal impedance across each of said plurality of said multiple emitter leads.

19. The power amplifier of claim 18 wherein said single thermal resistance structure is deposited on an exposed surface of said power amplifier.

20. The power amplifier of claim 18 wherein said power amplifier is a global system for mobile communications power amplifier module.

21. The power amplifier of claim 18 wherein said single thermal resistance structure provides a substantially uniform parasitic resistance for each transistor of said single transistor array.

* * * * *